(12) United States Patent
Yee

(10) Patent No.: US 7,352,071 B2
(45) Date of Patent: Apr. 1, 2008

(54) METHOD OF FABRICATING ANTI-WARP PACKAGE

(75) Inventor: Kuo-Chung Yee, Taipei (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 67 days.

(21) Appl. No.: 10/904,760

(22) Filed: Nov. 26, 2004

(65) Prior Publication Data

US 2005/0116359 A1 Jun. 2, 2005

(30) Foreign Application Priority Data

Dec. 1, 2003 (TW) .............................. 92133698 A

(51) Int. Cl.
*H01L 23/29* (2006.01)

(52) U.S. Cl. ............... 257/795; 438/110; 438/112; 438/113; 438/121; 438/127; 438/106; 438/460; 438/464; 257/E21.502

(58) Field of Classification Search ............. 257/795, 257/737, 778, 783, 787, 739, 676, E21.502; 438/123, 121, 106, 110, 112, 113, 127, 460, 438/464; 324/754

See application file for complete search history.

(56) References Cited

U.S. PATENT DOCUMENTS

| | | | | |
|---|---|---|---|---|
| 6,110,755 A * | 8/2000 | Muramatsu et al. | .......... | 438/26 |
| 6,194,291 B1 * | 2/2001 | DiStefano et al. | .......... | 438/455 |
| 6,287,895 B1 * | 9/2001 | Sato | .......... | 438/114 |
| 6,348,399 B1 * | 2/2002 | Lin | .......... | 438/616 |
| 6,355,499 B1 * | 3/2002 | Wu et al. | .......... | 438/106 |
| 6,469,530 B1 * | 10/2002 | Johnson et al. | .......... | 324/754 |
| 6,489,218 B1 * | 12/2002 | Kim et al. | .......... | 438/460 |
| 6,815,817 B2 * | 11/2004 | Akram et al. | .......... | 257/737 |
| 6,849,933 B2 * | 2/2005 | Koike et al. | .......... | 257/676 |
| 7,166,490 B2 * | 1/2007 | Michii et al. | .......... | 438/101 |
| 2002/0074672 A1 * | 6/2002 | Huang et al. | .......... | 257/788 |
| 2003/0146511 A1 * | 8/2003 | Zhao et al. | .......... | 257/739 |
| 2004/0058478 A1 * | 3/2004 | Islam et al. | .......... | 438/123 |
| 2004/0104488 A1 * | 6/2004 | Tao et al. | .......... | 257/787 |
| 2005/0035452 A1 * | 2/2005 | Zhang et al. | .......... | 257/738 |
| 2005/0146056 A1 * | 7/2005 | Shibata | .......... | 257/787 |
| 2005/0184364 A1 * | 8/2005 | Kim et al. | .......... | 257/666 |
| 2005/0214980 A1 * | 9/2005 | Shiu et al. | .......... | 438/123 |

* cited by examiner

*Primary Examiner*—Steven Loke
*Assistant Examiner*—Tram H Nguyen
(74) *Attorney, Agent, or Firm*—Jianq Chyun IP Office

(57) ABSTRACT

An anti-warp package comprising a packaging substrate, a chip and a stiffening member is provided. The chip is disposed on a top surface of the packaging substrate. The stiffening member is disposed on a bottom surface of the packaging substrate in a location underneath the surrounding area of the chip. Through the disposition of a stiffening member, warping stress on the packaging substrate when the chip is encapsulated by molding compound is counterbalanced.

20 Claims, 6 Drawing Sheets

METHOD OF FABRICATING ANTI-WARP PACKAGE

CROSS-REFERENCE TO RELATED APPLICATION

This application claims the priority benefit of Taiwan application serial no. 92133698, filed Dec. 1, 2003.

BACKGROUND OF THE INVENTION

1. Field of the Invention

The present invention relates to a package structure. More particularly, the present invention relates to an anti-warp package and method of fabricating the same.

2. Description of the Related Art

The semiconductor packaging process can be roughly subdivided into a series of individual steps including wafer sawing, chip attaching, wire bonding, molding, printing and packaging. Molding is one of the processing steps whose purpose is to provide a barrier to the penetration of moisture, a medium for transferring internally generated heat away, a suitable shape for handing and insulate the internal electrical devices from external electrical devices. In general, the molding process comprises placing a substrate having semiconductor chips or electronic devices thereon inside a mold, heating some solid epoxy molding compound to a liquid form and injecting the liquid compound into the mold cavities inside the mold by applying a pressure through a plunger. Ultimately, the molding compound encapsulates the semiconductor chips or electronic devices on the substrate to form an airtight package. After the molding compound is cured, the package is released from the mold.

To produce packages en-mass, a plurality of semiconductor chips or electronic devices are disposed on a packaging substrate and encapsulated all at the same time. Thereafter, the packaging substrate is sawed to produce a plurality of independent package units. However, the material of the molding compound used for encapsulating and the material of the packaging substrate normally have different coefficient of thermal expansion. Thus, the degree of expansion or contraction between the packaging substrate and the molding compound as the temperature variation during the curing process may create stress that leads to a warping of the packaging substrate. As a rule, the higher the curing temperature and the longer the curing time, the greater will be the degree of warping in the packaging substrate so that the packaging substrate is more difficult to saw. Furthermore, because the semiconductor chips and the electronic devices are bonded to the packaging substrate, any warping stress within the package may be transmitted to the semiconductor chips or the electronic devices as a bending torque as well. If the bending torque is too large, the semiconductor chips or the electronic devices can be damaged.

However, for an optical device having the aforementioned package structure such as a land grid array (LGA) package structure, the degree of warping in the packaging substrate could be substantially increased because a transparent resin must be used as the molding compound. In general, the degree of warping in the packaging substrate is increased because the coefficient of thermal expansion of a transparent packaging resin is higher than most non-transparent packaging resin. Thus, it is necessary to provide a packaging substrate having a structure capable of minimizing warping after molding.

SUMMARY OF THE INVENTION

Accordingly, the present invention provides an anti-warp package structure having a packaging substrate therein such that the problems and defects resulting from a warped packaging substrate are resolved.

The present invention provides a method of fabricating a package structure having a packaging substrate therein such that the problems and defects resulting from a warped packaging substrate are prevented. Hence, the yield and reliability of package production is improved.

As embodied and broadly described herein, the invention provides an anti-warp package structure. The package structure comprises a packaging substrate, a chip and a stiffening member. The chip is disposed on a top surface of the packaging substrate and the stiffening member is disposed on a bottom surface of the packaging substrate underneath an area surrounding the chip. Through the disposition of a stiffening member, warping stress on the packaging substrate when the chip is encapsulated by molding compound is counterbalanced.

The present invention also provides a method of fabricating a package comprising the following steps. First, a packaging substrate is provided. A chip is disposed on a top surface of the packaging substrate. Thereafter, a stiffening member is disposed on a bottom surface of the packaging substrate underneath the area surrounding the chip. Then, an encapsulant is formed to encapsulate the chip on the packaging substrate. After the encapsulant is formed, the packaging substrate is sawed to produce a plurality of individual package units to remove the stiffening member, wherein each package unit has the chip therein. In one embodiment of the present invention, the encapsulant is formed by the following steps, for example. First, an encapsulating mold having a top mold, a bottom mold and a gate is provided. The top mold has a mold cavity that corresponds to the chip and the bottom mold has a runner that corresponds to the stiffening member. The gate is located near the edge of the encapsulating mold connecting both the top mold cavity and the bottom mold cavity. The packaging substrate is placed between the top and the bottom of the encapsulating mold so that the chip are accommodated by the mold cavity and the stiffening member is accommodated by the runner mold cavity. Thereafter, a molding compound is injected through the gate to encapsulate the chip and the stiffening member on the packaging substrate.

Accordingly, the present invention utilizes the disposition of a stiffening member below a packaging substrate and the subsequent molding process to counterbalance the warping stress on the chip-disposing region of the packaging substrate. Hence, the package structure is able to prevent all those problems and defects that result from a warped packaging substrate.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
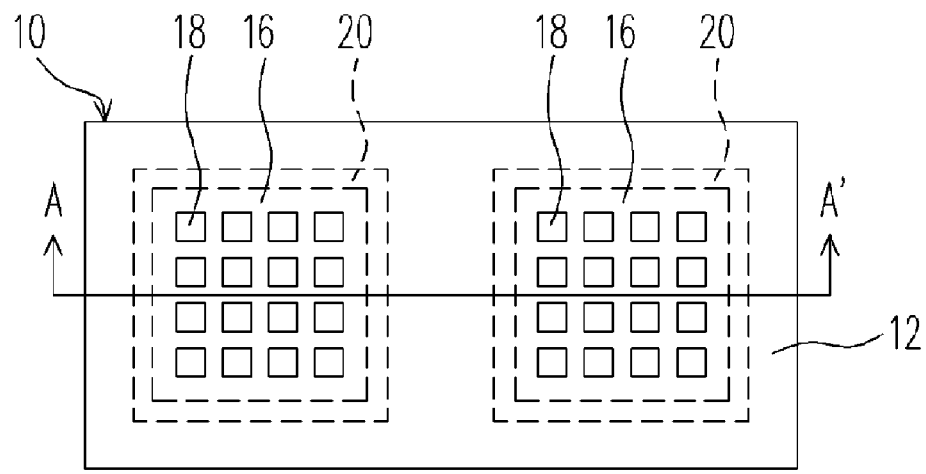
FIG. 1 is a top view of a package structure according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
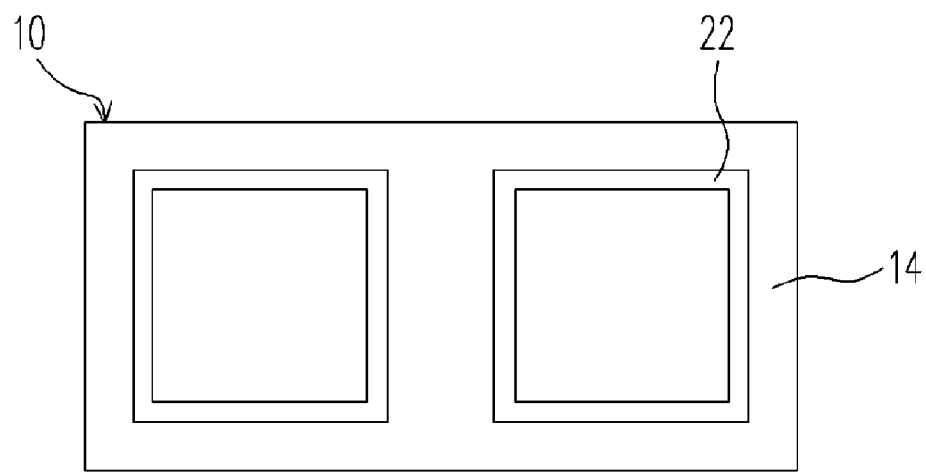
FIG. 2 is a bottom view of a package structure according to one embodiment of the present invention.
Figure 3:
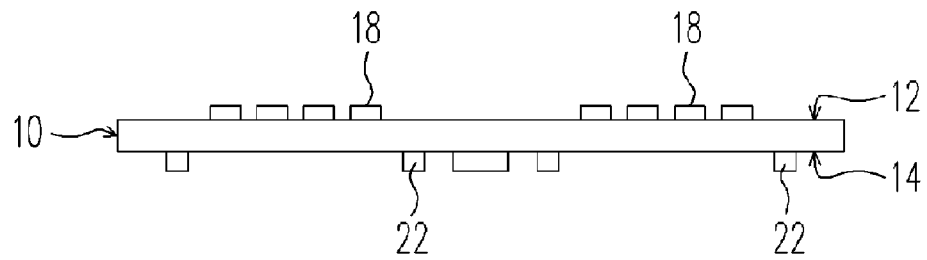
FIG. 3 is a cross-sectional view along line A-A of FIG. 1.

FIG. 1 is a top view of a package structure according to one embodiment of the present invention. FIG. 2 is a bottom view of a package structure according to one embodiment of the present invention. FIG. 3 is a cross-sectional view along line A-A of FIG. 1. As shown in FIGS. 1, 2 and 3, the packaging substrate 10 has a top surface 12 and a bottom surface 14. On the top surface 12 of the packaging substrate 10, two chip-disposing regions 16 are defined, for example. Each chip-disposing region 16 can accommodate a chip 18. The chip 18 is disposed within the chip-disposing region 16 and arranged in an array. A peripheral region 20 that encapsulates each chip-disposing region 16 is also defined on the packaging substrate 10. Furthermore, a stiffening ring 22 is disposed on an area of the bottom surface 14 underneath each peripheral region 20 as shown in FIG. 2.

Figure 4:
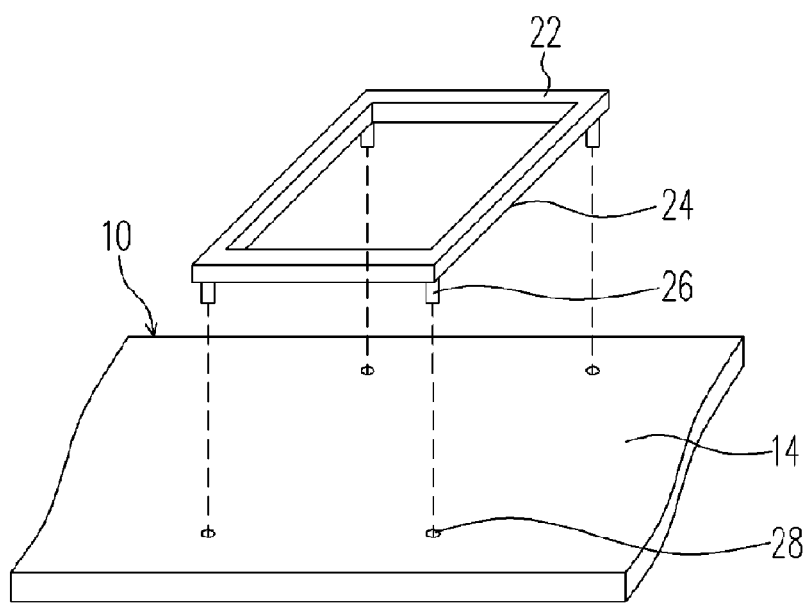
FIG. 4 is a perspective view showing the method of disposing a stiffening ring on a packaging substrate.

FIG. 4 is a perspective view showing the method of disposing a stiffening ring on a packaging substrate. As shown in FIG. 4, the bottom 24 of the stiffening ring 22 has a plurality of positioning pins 26 protruding down. Moreover, the positioning pins 26 are uniformly arranged on the bottom surface 24 of the stiffening ring 22. In addition, the bottom surface 14 of the packaging substrate 10 has a plurality of positioning holes 28 whose locations correspond with the positioning pins 26. The stiffening ring 22 is firmly attached to the bottom surface 14 of the packaging substrate 10 through the positioning pins 26 and the corresponding positioning holes 28. Preferably, an adhesive is applied to the bottom surface 24 of the stiffening ring 22 so that the stiffening ring 22 is permanently bonded to the bottom surface 14 of the packaging substrate 10.

According to one embodiment of the present invention, the stiffening ring 22 is fabricated using a heat-resistant plastic or a metal. Typically, the material of the stiffening ring 22 must be able to withstand a temperature at least as high as the melting point of the heat-resistant molding compound so that the stiffening ring 22 can prevent the packaging substrate from warping.

Figure 5:
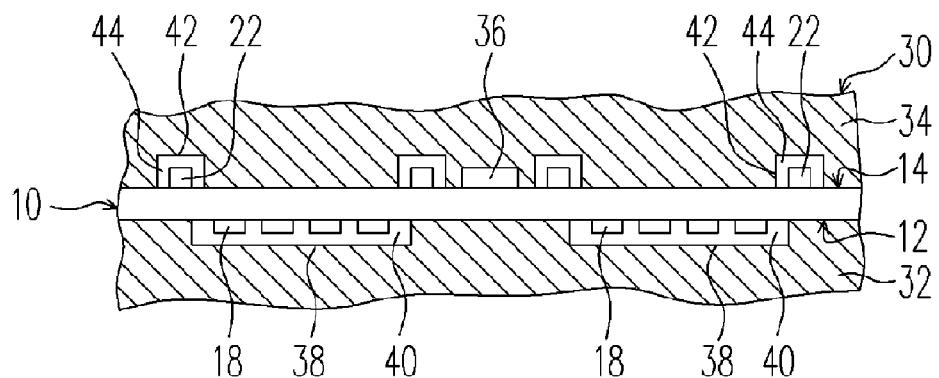
FIG. 5 is a cross-sectional view showing the packaging substrate shown in FIG. 3 disposed inside an encapsulating mold.
Figure 6:
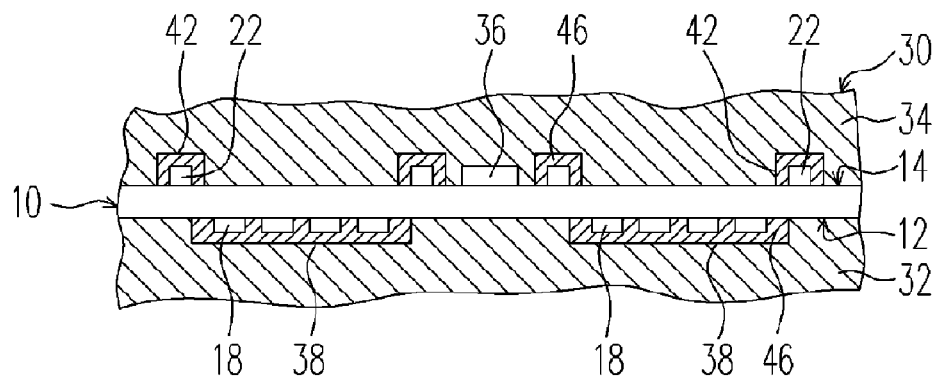
FIG. 6 is a cross-sectional view showing the packaging substrate in FIG. 5 after injecting a molding compound into the mold.

FIG. 5 is a cross-sectional view showing the packaging substrate shown in FIG. 3 disposed inside an encapsulating mold. In the present embodiment, the bottom surface 14 of the packaging substrate 10 faces up while the top surface 12 faces down inside the mold 30. The encapsulating mold 30 has a bottom mold 32, a top mold 34 and a gate 36. The bottom mold 32 faces the top surface 12 of the packaging substrate 10 and has two molding cavities 38 for accommodating the chip 18 within the chip-disposing regions 16 and providing space 40 for injecting molding compound over the chip 18. The top mold 34 faces the bottom surface 14 of the packaging substrate 10 and has two ring type runners 42 for accommodating two stiffening rings 22 and providing space 44 for injecting molding compound over the stiffening rings 22. Furthermore, the gate 34 is located on the top mold 34 of the encapsulating mold 30 and connected to the mold cavities 38 and the runners 42 through other runners (not shown). To mold the packaging substrate 20, a molding compound 46 is injected into the gate 36 to fill up the space 40 and 44 defined by the mold cavities 38 and the runner 42. Hence, the chip 18 and the stiffening rings 22 are encapsulated by the molding compound 46 as shown in FIG. 6.

It should be noted that the bottom surface 14 of the packaging substrate 10 faces up inside the mold 30 to prevent the stiffening ring 22 from falling off from the bottom surface 14 of the packaging substrate 10 during mold injection. However, if the stiffening ring 22 is engaged to the bottom surface 14 of the packaging substrate 10 through any type of fastening mechanism such as a latch or positioning pins 26 with adhesive, the bottom surface 14 of the packaging substrate 10 may face down during mold injection.

Figure 7:
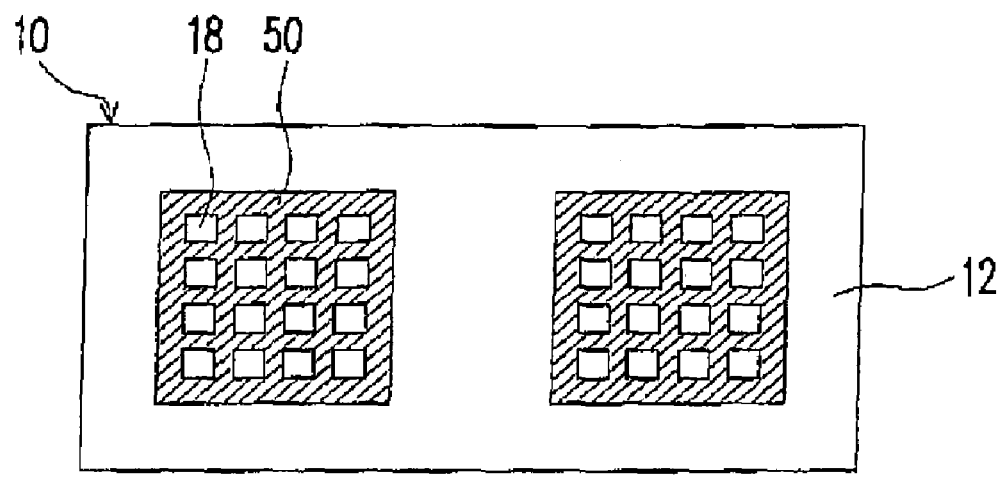
FIG. 7 is a top view showing the full package structure after molding and curing.
Figure 8:
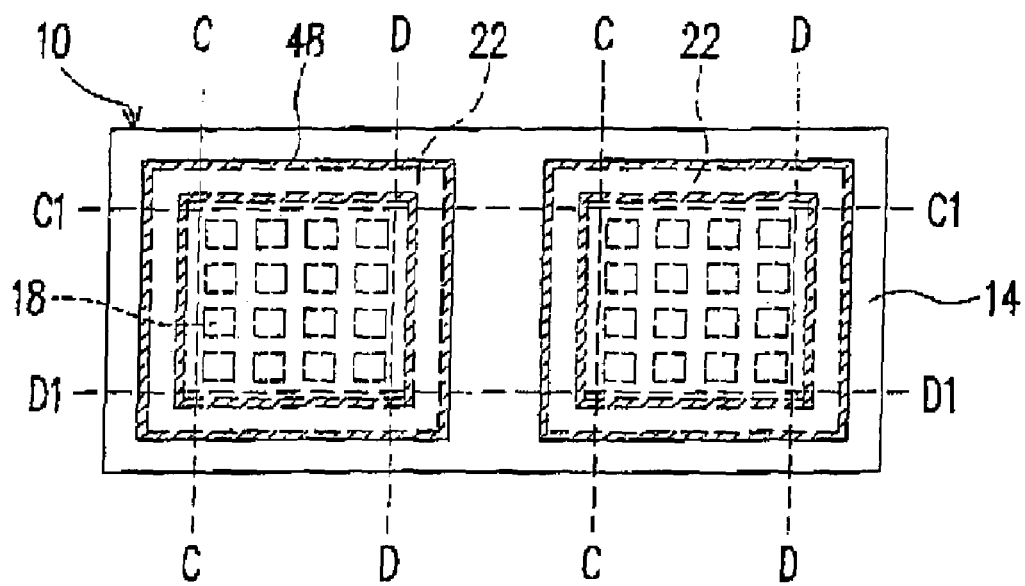
FIG. 8 is a bottom view showing the full package structure after molding and curing.

When the molding process and a subsequent curing process are complete, the top and bottom view of the packaging substrate is as shown in FIGS. 7 and 8. The cured molding compound 46 encapsulates the chip 18 on the top surface 12 of the packaging substrate 10 to form a chip encapsulant 50. Similarly, the cured molding compound 46 encapsulates the stiffening ring 22 on the bottom surface 14 of the packaging substrate 10 to form a stiffener encapsulant 48. In FIG. 8, the position of the chip 18 on the top surface 12 is also shown in this drawing. Finally, the packaging substrate 10 is sawed to form individual package units in a singulation process, wherein each package unit encapsulates the chip 18. The stiffening rings 22 are removed by sawing along the lines C-C, D-D, C1-C1 and D1-D1 in the singulation process.

The embodiment of the present invention is best applied to the fabrication of an optical land grid array (LGA) package. If the present invention is applied to fabricate an optical LGA package, the chip 18 in FIG. 7 includes optical devices and the molding compound 46 for encapsulating the chip 18 is a transparent molding resin. It should be noted that the packaging substrate of the present invention has a structure capable of counterbalancing any warping stress on the substrate resulting form a difference in coefficient of thermal expansion between the transparent molding resin and the packaging substrate.

Figure 9:
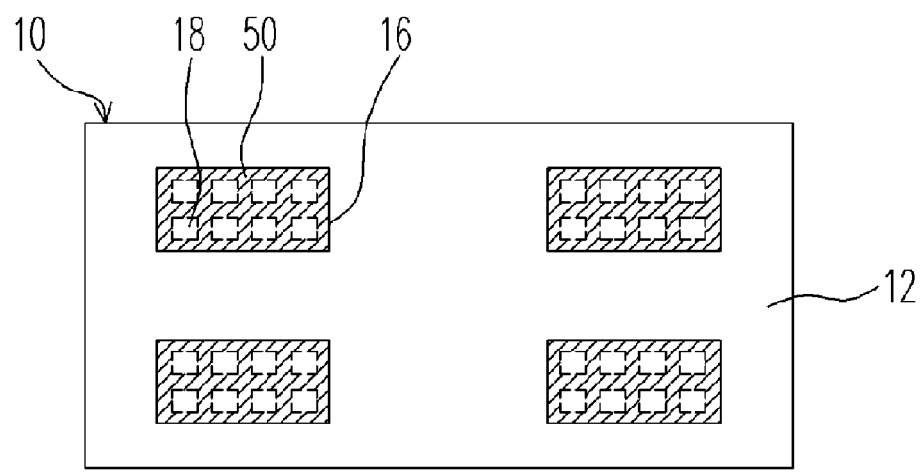
FIG. 9 is a top view showing the molded structure of a package having four chip disposing regions.
Figure 10:
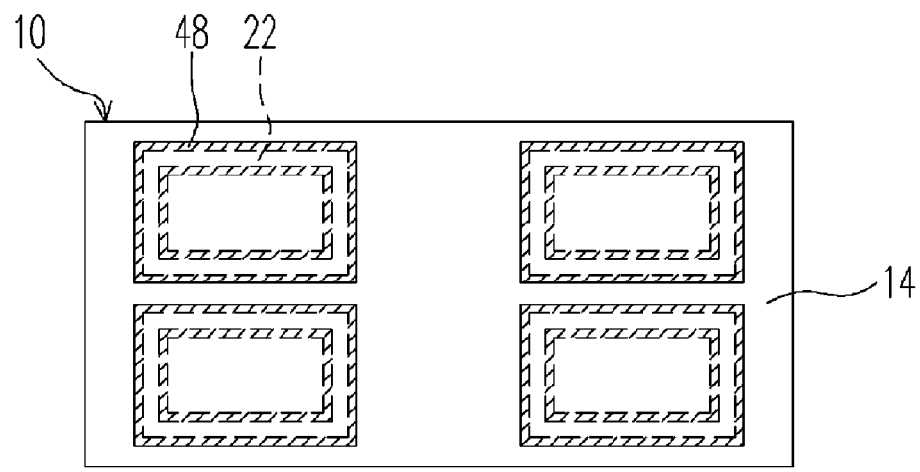
FIG. 10 is a bottom view showing the molded structure of a package having four chip disposing regions.

FIG. 9 is a top view showing the molded structure of a package having four chip disposing regions. FIG. 10 is a bottom view showing the molded structure of a package having four chip disposing regions. In the present embodiment, the top surface 12 of the packaging substrate 10 has four chip-disposing regions 16 altogether. Each chip-disposing region 16 accommodates a chip 18. Furthermore, a stiffening ring 22 is disposed on the bottom surface 14 of the packaging substrate 10 underneath the peripheral areas of the chip-disposing regions 16 to strengthen the packaging substrate 10. Then, an encapsulant is formed to encapsulate the chip on the packaging substrate. In the present embodiment, a molding compound is injected to form a chip encapsulant encapsulating the chip 18. Moreover, a stiffener encapsulant is further formed by the molding process to encapsulate each stiffening ring 22, for example. Finally, the stiffening rings 22 are removed in the singulation process for sawing the packaging substrate into individual package units each encapsulating the chip 18.

According to the aforementioned embodiment, the present invention can be applied to a packaging substrate having a plurality of chip-disposing regions. By disposing a stiffening ring on the bottom surface of a packaging substrate to correspond with each chip-disposing region, the warping stress on the packaging substrate resulting from mold injection is counterbalanced.

Figure 11:
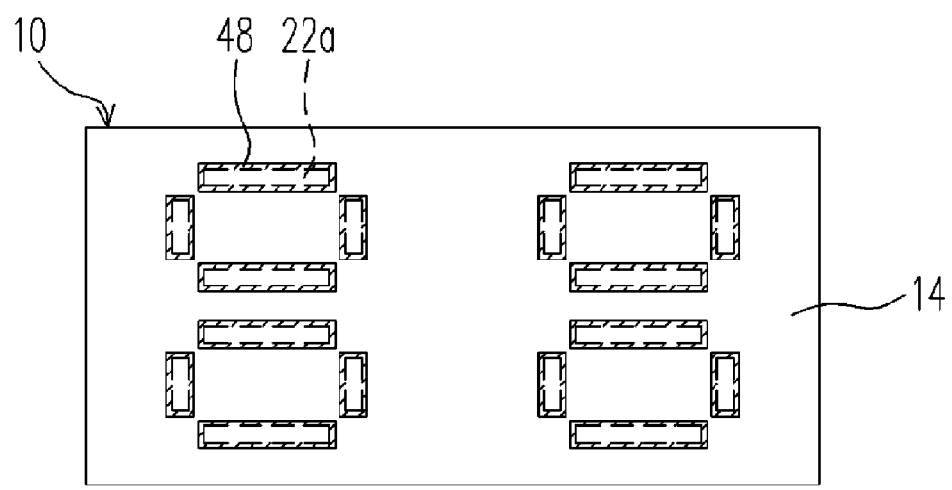
FIG. 11 is a top view showing the stiffening bars on a packaging substrate according to another embodiment of the present invention.

According to another embodiment of the present invention, the stiffening rings 22 in FIG. 10 can be replaced by a plurality of stiffening bars 22a as shown in FIG. 11 to prevent the packaging substrate from warping. Furthermore, it should be noted that the number of chip-disposing areas encapsulated by the stiffening ring or stiffening bars on the bottom surface 14 of the packaging substrate is not limited to one or two. In general, a plurality of stiffening rings or bars can be used to support a multiple of chip-disposing regions.

In summary, one major aspect of the present invention is the set up of a stiffening member such as a stiffening ring or a series of stiffening bars on the bottom surface of a packaging substrate to reinforce the structural strength of the packaging substrate. Furthermore, in the process of encapsulating the chip and the stiffening members with a molding compound, the stiffening members can also counterbalance the warping stress resulting from a difference in coefficient of thermal expansion between the top and bottom surface of the packaging substrate. Ultimately, the amount of warping in the packaging substrate is substantially minimized.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a package, comprising the steps of:
    providing a packaging substrate having a top surface and a bottom surface, wherein the top surface has at least a chip-disposing region;
    disposing a plurality of chips on the chip-disposing region;
    disposing at least a stiffening member on the bottom surface of the packaging substrate, wherein the stiffening member is disposed underneath a peripheral area encircling the chip-disposing region without overlapping with the chips;
    forming an encapsulant to encapsulate the chips on the packaging substrate; and
    sawing the packaging substrate along lines between the chips and the stiffening member to form a package unit, wherein the stiffening member underneath the peripheral area is concurrently removed while sawing the packaging substrate, and said package unit encapsulates at least one chip.

2. The method of claim 1, wherein the bottom surface of the packaging substrate faces up while the top surface of the packaging substrate faces down when injecting a molding compound into a mold through a gate so that the molding compound is injected with the packaging substrate inverted.

3. The method of claim 2, wherein a material of the molding compound comprises a transparent molding resin.

4. The method of claim 3, wherein the at least one chip comprises optical devices.

5. The method of claim 1, wherein each of the package units comprises a land grid array (LGA) package.

6. The method of claim 1, wherein the step of disposing the stiffening member comprises inserting a plurality of positioning pins of the stiffening member into a plurality of positioning holes on the bottom surface of the packaging substrate so as to fasten the stiffening member firmly to the packaging substrate.

7. The method of claim 1, wherein the stiffening member comprises a stiffening ring.

8. The method of claim 7, wherein a material of the stiffening member comprises metal.

9. The method of claim 7, wherein a material of the stiffening member comprises plastic.

10. The method of claim 1, wherein the stiffening member comprises a plurality of stiffening bars.

11. The method of claim 10, wherein a material of the stiffening member comprises metal.

12. The method of claim 10, wherein a material of the stiffening member comprises plastic.

13. The method of claim 10, wherein forming the encapsulant to encapsulate the chips on the packaging substrate comprising:
    providing an encapsulating mold having a top mold, a bottom mold and a gate, wherein the bottom mold has at least a molding cavity corresponding to the chip-disposing region, the top mold has at least a runner corresponding to the stiffening member and the gate is located on the encapsulating mold for connecting both of the molding cavity and the runner;
    placing the packaging substrate between the top and the bottom molds of the encapsulating mold so that the chip-disposing region is accommodated by the molding cavity and the stiffening member is accommodated by the runner;
    injecting a molding compound into the encapsulating mold through the gate to encapsulate the chips and the stiffening member on the packaging substrate.

14. A method of fabricating a package, comprising the steps of:
    providing a packaging substrate having a top surface end a bottom surface, wherein the top surface has a plurality of chip-disposing regions;
    disposing an array of chips on each of the chip-disposing regions;
    disposing a plurality of stiffening members on the bottom surface of the packaging substrate, wherein each stiffening member is disposed underneath a peripheral area encircling each chip-disposing region without overlapping with the array of chips;
    forming an encapsulant to encapsulate the chips and the stiffening members on the top and bottom surfaces of the packaging substrate; and
    sawing the packaging substrate along the lines between the array of chips and the stiffening member to form a package unit, wherein the stiffening member at the peripheral area is concurrently removed while sawing the packaging substrate, and said package unit encapsulates at least one chip.

15. The method of claim 14, wherein the array of chips comprises at least one optical device and a material of the encapsulant comprises a transparent molding resin.

16. The method of claim 14, wherein each of the package units comprises a land grid array (LGA) package.

17. The method of claim 14, wherein the step of disposing the stiffening member comprises inserting a plurality of positioning pins of the stiffening member into a plurality of positioning holes on the bottom surface of the packaging substrate, so as to fasten the stiffening member firmly to the packaging substrate.

18. The method of claim 14, wherein the stiffening member comprises a stiffening ring.

19. The method of claim 14, wherein the stiffening member comprises a plurality of stiffening bars.

20. The method of claim 14, wherein a material of the stiffening member is metal or plastic.

* * * * *